(12) United States Patent
Ray et al.

(10) Patent No.: US 9,673,039 B2
(45) Date of Patent: Jun. 6, 2017

(54) DEVICES COMPRISING HIGH-K DIELECTRIC LAYER AND METHODS OF FORMING SAME

(71) Applicant: GLOBALFOUNDRIES Inc., Grand Cayman (KY)

(72) Inventors: Shishir Ray, Clifton Park, NY (US); Yiqun Liu, Ashburn, VA (US); Jin Ping Liu, Ballston Lake, NY (US); Fabio D'Addamio, Saratoga Springs, NY (US); Sandeep Gaan, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 64 days.

(21) Appl. No.: 14/666,787

(22) Filed: Mar. 24, 2015

(65) Prior Publication Data

US 2016/0284540 A1 Sep. 29, 2016

(51) Int. Cl.

| H01L 21/316 | (2006.01) |
|---|---|
| H01L 21/02 | (2006.01) |
| H01L 21/28 | (2006.01) |
| C23C 16/30 | (2006.01) |
| G11C 11/22 | (2006.01) |
| H01L 29/51 | (2006.01) |

(52) U.S. Cl.
CPC .... *H01L 21/02181* (2013.01); *H01L 21/0234* (2013.01); *H01L 21/02189* (2013.01); *H01L 21/28185* (2013.01); *H01L 21/28194* (2013.01); *H01L 29/517* (2013.01); *C23C 16/308* (2013.01); *G11C 11/22* (2013.01); *H01L 29/513* (2013.01)

(58) Field of Classification Search
CPC . G11C 11/22; C23C 16/308; H01L 21/02181; H01L 21/02189; H01L 21/0234; H01L 21/02351; H01L 21/02356
See application file for complete search history.

(56) References Cited

U.S. PATENT DOCUMENTS

| 7,833,913 B2* | 11/2010 | Clark | C23C 16/308 257/E21.241 |
|---|---|---|---|
| 9,190,266 B1* | 11/2015 | Stemmer | H01L 21/02315 |
| 2010/0006953 A1* | 1/2010 | Boescke | G11C 11/22 257/410 |
| 2013/0175665 A1* | 7/2013 | Chudzik | H01L 21/02181 257/532 |
| 2015/0017813 A1* | 1/2015 | Akiyama | C23C 16/405 438/763 |

* cited by examiner

*Primary Examiner* — Cheung Lee
*Assistant Examiner* — Stephen C Smith
(74) *Attorney, Agent, or Firm* — Heslin Rothenberg Farley & Mesiti P.C.

(57) ABSTRACT

Provided is a semiconductor device that includes a semiconductor substrate and a 10 to 40 Å thick high-k dielectric layer that contains one or both of hafnium dioxide ($HfO_2$) and zirconium dioxide ($ZrO_2$). The high-k dielectric layer is disposed on the semiconductor substrate, and it contains at least some tetragonal phase $HfO_2$ and/or tetragonal phase $ZrO_2$. Also provided are methods for making the semiconductor device, and electronic devices that employ the semiconductor device.

12 Claims, 7 Drawing Sheets

Helium plasma deposition: step-1

FIG. 1A

Helium plasma deposition: step-1

FIG. 1B

High voltage bias application: step-2

DEVICES COMPRISING HIGH-K DIELECTRIC LAYER AND METHODS OF FORMING SAME

FIELD OF THE INVENTION

The present invention generally relates to devices including a high-k dielectric layer and to methods of forming the same.

BACKGROUND OF THE INVENTION

The advancement of technology development in the semiconductor field has been constrained by the existence of high-k metal gate thin film crystallization issues that lead or contribute to the degradation in dielectric properties of dielectric materials. This is the case, for example, with hafnium dioxide ($HfO_2$), which may be used as a gate dielectric material, including for 20 nm technology and beyond.

Effective oxide thickness (EOT) scaling has been a particular challenge, due to: lack of Jg (gate leakage) improvement (i.e., the dielectric constant value is not high enough to support further scaling of high-K film thickness); and degradation in film quality in terms of the crystalline nature of the dielectric material (e.g., for $HfO_2$, retention of desired tetragonal phase in order to achieve adequate reliability).

Attempts to address the above-described constraints include a traditionally-used post deposition anneal (PDA), but this approach causes uncontrolled interlayer (IL) regrowth without the benefit of densification and without significant improvement in the dielectric constant (k). Lanthanum (La) doping is also used in an attempt to try to address these constraints, but this approach also has its drawbacks, including the fact that its applicability is limited to nFETs due to work function (WF) constraints.

Thus, a need exists for improved semiconductor devices having a high-k dielectric, and methods of forming the same, that address high-K metal gate thin film crystallization issues and reduce degradation to the dielectric properties of dielectric materials.

While certain aspects of conventional technologies have been discussed to facilitate disclosure of the invention, Applicant in no way disclaims these technical aspects, and it is contemplated that the claimed invention may encompass one or more of the conventional technical aspects discussed herein.

In this specification, where a document, act or item of knowledge is referred to or discussed, this reference or discussion is not an admission that the document, act or item of knowledge or any combination thereof was, at the priority date, publicly available, known to the public, part of common general knowledge, or otherwise constitutes prior art under the applicable statutory provisions; or is known to be relevant to an attempt to solve any problem with which this specification is concerned.

SUMMARY OF THE INVENTION

Briefly, the present invention satisfies the need for improved semiconductor devices having a high-k dielectric, and methods of forming the same, that address high-K metal gate thin film crystallization issues and reduce degradation to the dielectric properties of dielectric materials. As described in more detail below, it has been found that improvement of dielectric film properties can be achieved in a high-k dielectric layer and device including such layer by applying a high voltage bias, without increasing the thermal budget. Embodiments of the invention eliminate the need for a PDA (although PDA may still be performed if desired).

In a first aspect, the invention provides a semiconductor device that includes:
  a semiconductor substrate; and
  a 10 to 40 Å thick high-k dielectric layer containing at least one of hafnium dioxide ($HfO_2$) and zirconium dioxide ($ZrO_2$), said high-k dielectric layer being disposed on the semiconductor substrate, and containing at least some tetragonal phase $HfO_2$ or tetragonal phase $ZrO_2$.

In a second aspect, the invention provides a device (e.g., an electronic device) that contains the semiconductor device according to the first aspect of the invention.

In a third aspect, the invention provides a method of forming a semiconductor device, said method including:
  forming, on a semiconductor substrate, a 10 to 40 Å thick dielectric layer that includes at least one of hafnium dioxide ($HfO_2$) and zirconium dioxide ($ZrO_2$), said dielectric layer having a continuous planar surface;
  after forming the dielectric layer, performing plasma deposition of an inert gas, such that the inert gas penetrates the continuous planar surface of the dielectric layer, thereby forming an inert gas impregnated dielectric layer; and
  after performing the plasma deposition, applying a high voltage bias to the inert gas impregnated dielectric layer, thereby forming a high-k dielectric layer that contains at least some tetragonal phase $HfO_2$ or tetragonal phase $ZrO_2$.

The present invention may address one or more of the problems and deficiencies of the art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

Certain embodiments of the presently-disclosed semiconductor devices and methods of forming the same have several features, no single one of which is solely responsible for their desirable attributes. Without limiting the scope of these devices and methods as defined by the claims that follow, their more prominent features will now be discussed briefly. After considering this discussion, and particularly after reading the section of this specification entitled "Detailed Description of the Invention," one will understand how the features of the various embodiments disclosed herein provide a number of advantages over the current state of the art. These advantages may include, without limitation, providing improved semiconductor devices and methods by, for example, incorporating high-k dielectrics having improved dielectric properties (e.g., attributable to improved retention of desired tetragonal phase dielectric materials) that provide for devices and methods having improved reliability; improving the dielectric constant of a high-k dielectric film containing $HfO_2$ and/or $ZrO_2$; optionally eliminating the requirement of a post deposition anneal (PDA); providing improved pFETs and nFETs; improving reliability parameters such as bias temperature instability (BTI) and time dependent dielectric breakdown (TDDB); and improving high-k film quality, including for 14 nm and beyond, as a replacement of PDA or in conjunction with PDS. The inventive devices and methods may be applied beyond logic devices. The scope of their relevance encompasses any MOSFET process where ceramic dielectric material is used for a gate. These and other features and advantages of this invention will become apparent from the following detailed description of the various aspects of the invention taken in conjunction with the appended claims and the accompanying drawings.

DETAILED DESCRIPTION OF THE INVENTION

The present invention is generally directed to semiconductor devices having a high-k dielectric, to methods of forming the same, and to electronic devices that contain the same.

Although this invention is susceptible to embodiment in many different forms, certain embodiments of the invention are shown and described. It should be understood, however, that the present disclosure is to be considered as an exemplification of the principles of this invention and is not intended to limit the invention to the embodiments illustrated.

In a first aspect, the invention provides a semiconductor device that includes:
  a semiconductor substrate; and
  a 10 to 40 Å thick high-k dielectric layer containing at least one of hafnium dioxide ($HfO_2$) and zirconium dioxide ($ZrO_2$), said high-k dielectric layer being disposed on the semiconductor substrate, and containing at least some tetragonal phase $HfO_2$ or tetragonal phase $ZrO_2$.

The semiconductor substrate includes one or more layers, and may optionally include one or more of a channel region, electrode(s), and an interfacial layer (e.g., $SiO_2$ or SiOH). The semiconductor substrate may be doped or undoped, and may optionally contain doped and undoped regions therein. The semiconductor substrate may optionally be pre-treated with any desirable pre-treatment (e.g., OH-terminated).

In some embodiments, the semiconductor substrate contains silicon. In some embodiments, the semiconductor substrate contains a silicon dioxide interlayer. In some such embodiments, the high-k dielectric layer is formed directly on the silicon dioxide interlayer.

The term "high-k dielectric layer" is a layer that contains a high-k dielectric material, i.e., a material with a high dielectric constant (k), as compared to silicon dioxide (for which k=3.9). A high-k dielectric layer (which may also be referred to as a film) is typically used in place of a silicon dioxide gate dielectric or another dielectric layer of a device in semiconductor manufacturing processes. Replacement of $SiO_2$ and/or other dielectric layers with high-k layers allows the semiconductor industry to further drive down pattern dimensions in order to reduce transistor size and enhance processor speed in accordance with Moore's Law.

The high-k dielectric layer is disposed on the semiconductor substrate, and contains one or more of hafnium dioxide ($HfO_2$) and zirconium dioxide ($ZrO_2$). Known crystalline phases of $HfO_2$ and $ZrO_2$ include cubic, tetragonal, and monoclinic. In the high-k dielectric layer of the present invention, at least some of the $HfO_2$ or $ZrO_2$ present exists in the tetragonal phase. This tetragonal phase $HfO_2$ or $ZrO_2$ remains stable at room temperature.

In some embodiments, the high-k dielectric layer contains tetragonal phase $HfO_2$. In some embodiments, the high-k dielectric layer contains $HfO_2$ and at least 50% (e.g., 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100%, including any and all ranges and subranges therein) of the $HfO_2$ in the high-k dielectric layer is in the tetragonal phase.

In some embodiments, the high-k dielectric layer contains tetragonal phase $ZrO_2$. In some embodiments, the high-k dielectric layer contains $ZrO_2$ and at least 50% (e.g., 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100%, any and all ranges and subranges therein) of the $ZrO_2$ in the high-k dielectric layer is in the tetragonal phase.

In some embodiments, the high-k dielectric layer contains both $HfO_2$ and $ZrO_2$ (e.g., $Hf_{1-x}Zr_xO_2$).

In some embodiments, the high-k dielectric layer contains monoclinic phase $HfO_2$ and tetragonal phase $HfO_2$. In some embodiments, the high-k dielectric layer contains monoclinic phase $ZrO_2$ and tetragonal phase $ZrO_2$. In some embodiments, the high-k dielectric layer contains both tetragonal phase $HfO_2$ and tetragonal phase $ZrO_2$. In some embodiments, the high-k dielectric layer contains both tetragonal phase $HfO_2$ and tetragonal phase $ZrO_2$ and monoclinic phase $HfO_2$ and monoclinic phase $ZrO_2$.

In some embodiments, the high-k dielectric layer consists essentially of $HfO_2$, $ZrO_2$, or a combination thereof. In some embodiments, the high-k dielectric layer consists of $HfO_2$, $ZrO_2$, or a combination thereof.

In some embodiments, the high-k dielectric layer is not lanthanum-doped.

The high-k dielectric layer is 10 to 40 Å thick (e.g., 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 Å thick), including any and all ranges and subranges therein. For example, in some embodiments, the high-k dielectric layer is 10 to 20 Å thick.

In a second aspect, the invention provides a device (e.g., an electronic device) that contains the semiconductor device according to the first aspect of the invention.

In a third aspect, the invention provides a method of forming a semiconductor device, said method including:
  forming, on a semiconductor substrate, a 10 to 40 Å thick dielectric layer that includes at least one of hafnium dioxide ($HfO_2$) and zirconium dioxide ($ZrO_2$), said dielectric layer having a continuous planar surface;
  after forming the dielectric layer, performing plasma deposition of an inert gas, such that the inert gas penetrates the continuous planar surface of the dielectric layer, thereby forming an inert gas impregnated dielectric layer; and
  after performing the plasma deposition, applying a high voltage bias to the inert gas impregnated dielectric layer, thereby forming a high-k dielectric layer that contains at least some tetragonal phase $HfO_2$ or tetragonal phase $ZrO_2$.

The high-k dielectric layer corresponds to that described supra in accordance with the first aspect of the invention. In some embodiments, the dielectric layer is formed directly on a silicon dioxide interlayer of the semiconductor substrate. The dielectric layer may be formed using any art-acceptable techniques, which are well known to persons having ordinary skill in the art. For example, in some embodiments, the dielectric layer is formed via atomic layer deposition (ALD). In some embodiments, the dielectric layer is formed via a metal-organic chemical vapor deposition method (MOCVD), plasma-enhanced ALD (PEALD), reactive sputtering method, or an atomic layered chemical vapor deposition method (ALCVD).

As used herein, "continuous planar surface" refers generally to an uninterrupted substantially flat surface.

In some embodiments, the dielectric layer is formed directly on a silicon dioxide ($SiO_2$) interlayer that constitutes or is contained within the semiconductor substrate.

In some embodiments, the hafnium dioxide ($HfO_2$) and/or zirconium dioxide ($ZrO_2$) that is deposited to form the dielectric layer is in the monoclinic phase.

After forming the dielectric layer, plasma deposition of an inert gas is performed. For example, in some embodiments, low energy (100-500V) is applied to generate high density plasma with a high dose of inert gas (dose>1e15). This results in the inert gas penetrating the continuous planar surface of the dielectric layer, thereby forming an inert gas impregnated dielectric layer.

In some embodiments, the inert gas is selected from helium (He) and argon (Ar). After performing the plasma deposition, a high voltage bias is applied to the inert gas impregnated dielectric layer, thereby forming a high-k dielectric layer that contains at least some tetragonal phase $HfO_2$ or tetragonal phase $ZrO_2$. For example, the bias voltage can be applied between wafer chuck/substrate with dielectric film as anode and the process chamber wall. The process chamber may be connected to ground to generate high voltage bias, in a range of, e.g., 7 kV-15 kV, including any and all ranges and subranges therein.

Without being bound to theory, it is believed that the plasma deposition of the inert gas (e.g., He) results in an oxygen deficiency within the dielectric layer during the subsequent high voltage bias, which contributes to the ready transformation of at least a portion of the metal oxide in the as-formed dielectric film ($HfO_2$ and/or $ZrO_2$) into tetragonal phase, which is a crystalline phase known to have a higher dielectric constant.

In some embodiments, the high-k dielectric layer, as described above, contains both tetragonal phase $HfO_2$ and tetragonal phase $ZrO_2$.

In some embodiments, the high voltage bias results in at least 50% of the $HfO_2$ and/or $ZrO_2$ present in the high-k dielectric being in the tetragonal phase.

Figure 1A:
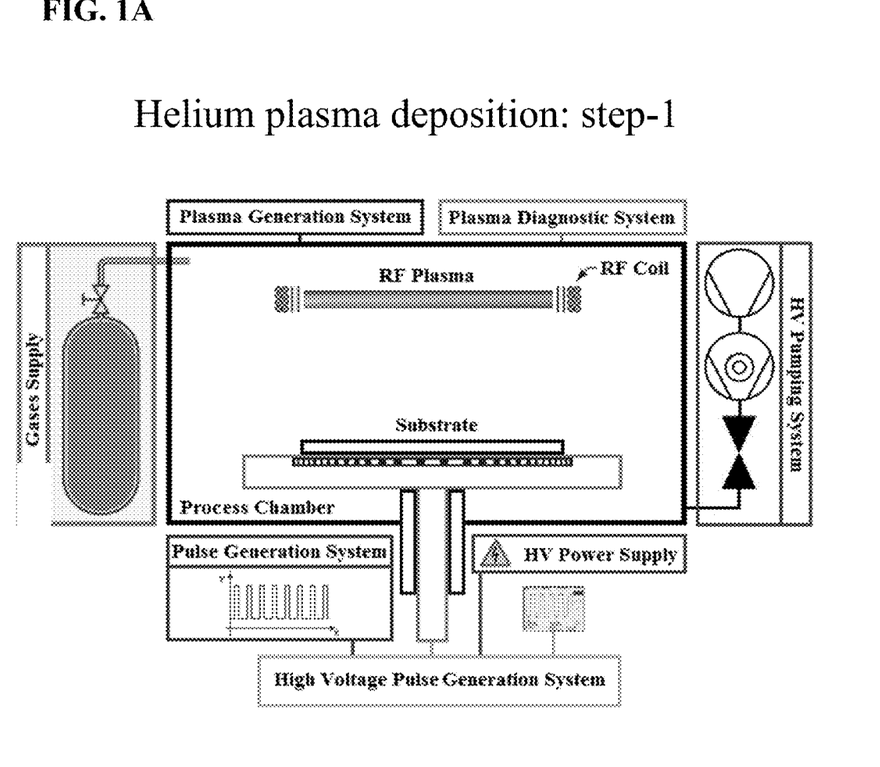
FIGS. 1A and 1B depict simple schematics showing the plasma deposition and high voltage bias steps performed in accordance with an embodiment of the invention.
Figure 1B:
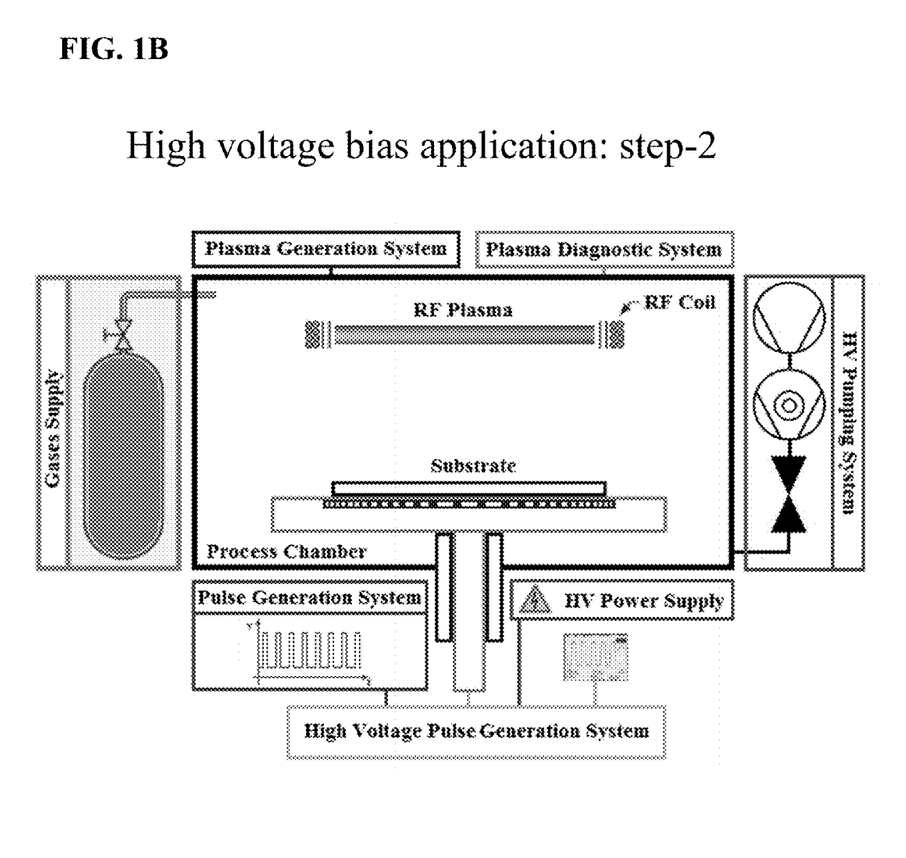

FIGS. 1A and 1B depict a simple schematic showing the plasma deposition and high voltage bias steps performed in accordance with an embodiment of the invention in an Applied materials Pulsed plasma (PLAD) tool. The depicted embodiments show a first He plasma step, followed by a high voltage bias step. As shown, PLAD and a high voltage bias are used to deposit an inert gas, e.g., helium, which penetrates the continuous planar surface of the dielectric layer.

Figure 2:
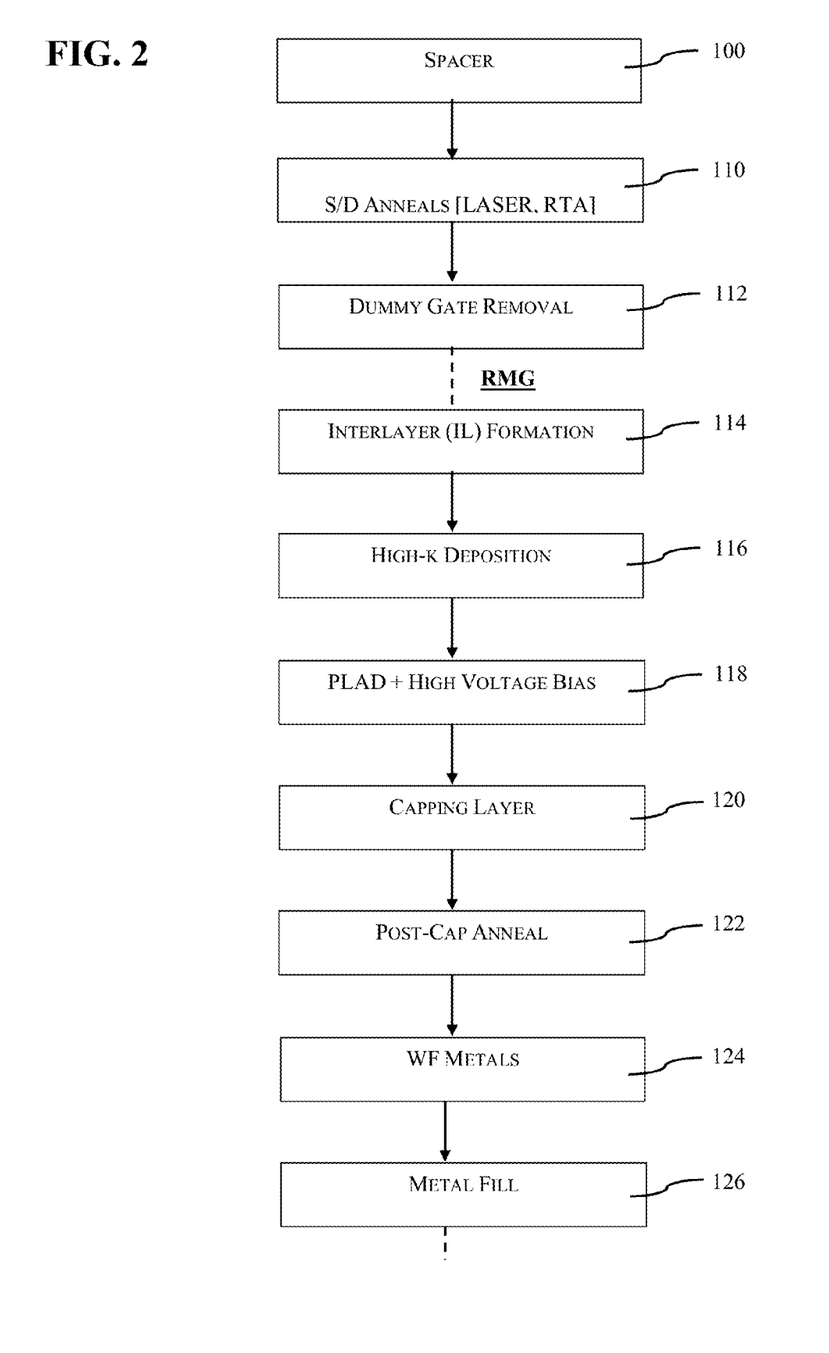
FIG. 2 depicts a flow chart showing an embodiment of the inventive method of forming a semiconductor device.

FIG. 2 depicts a flow chart showing an embodiment of the inventive method of forming a semiconductor device. As shown, the depicted embodiment includes process steps 100, 110, 112, 114, 116, 118, 120, 122, 124, and 126. Process step 118 ("PLAD+High Voltage Bias") refers to the above-discussed steps of (i) performing plasma deposition (PLAD) of an inert gas to form the inert gas impregnated dielectric layer; and (ii) applying the high voltage bias to the inert gas impregnated dielectric layer, thereby forming a high-k dielectric layer that contains at least some tetragonal phase $HfO_2$ or tetragonal phase $ZrO_2$. In some embodiments, process step 118 replaces a PDA used in the prior art process of record, thereby eliminating the problem of uncontrolled IL regrowth experienced in the prior art due to additional thermal budget. In other embodiments, a PDA is optionally still performed after process step 118 (e.g., before process step 120).

Methods of the invention may include, or be used together with other semiconductor fabrication processes, which are well known in the art.

EXAMPLES

The invention will now be illustrated, but not limited, by reference to the specific embodiments described in the following examples.

Example 1

Figure 3A:
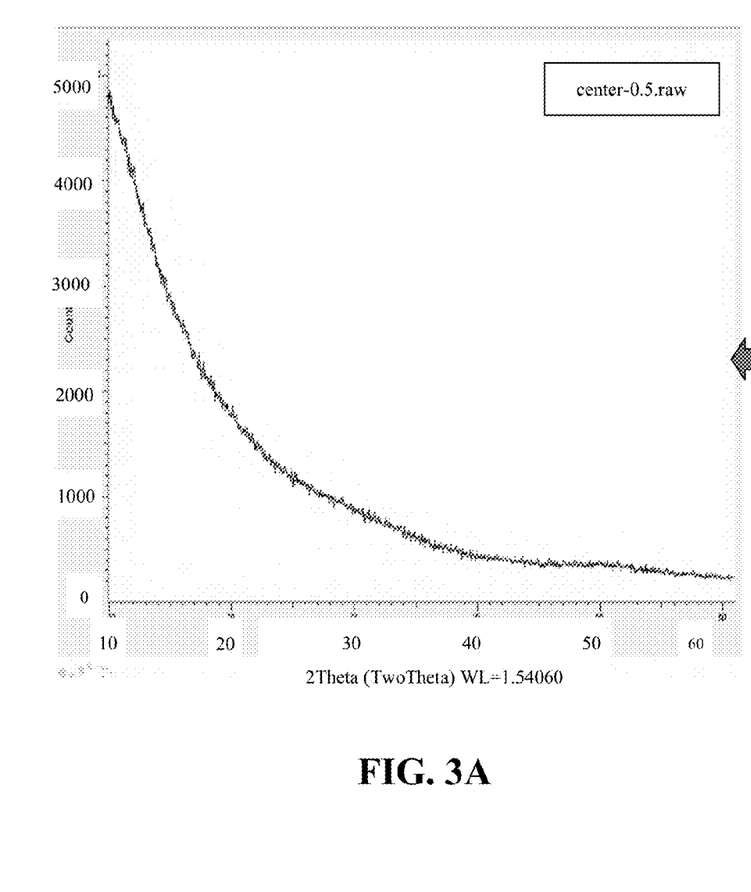
FIGS. 3A-H depict charts showing properties relating to embodiments of the invention and comparative examples.
Figure 3B:
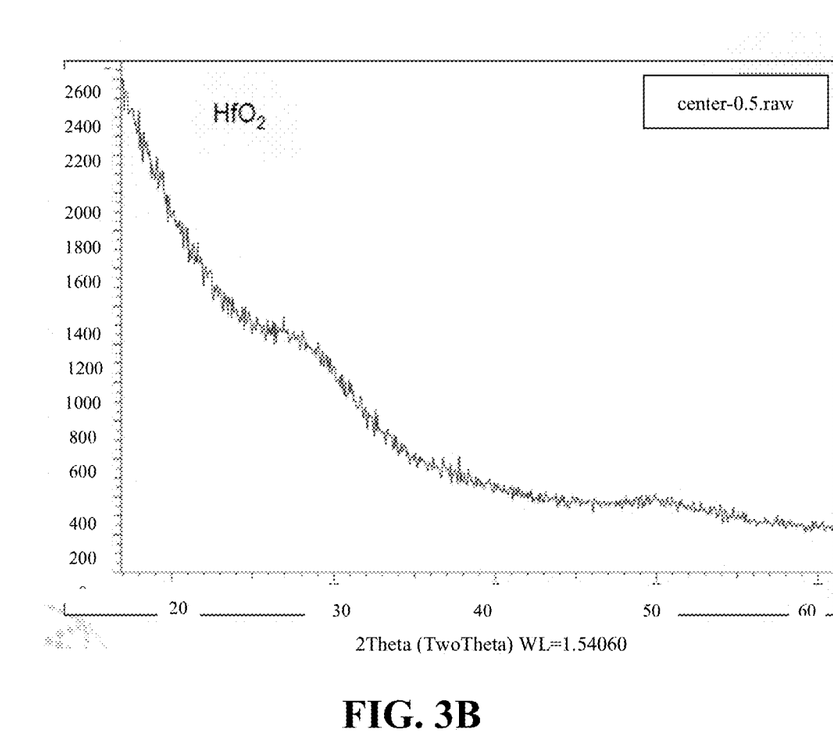
Figure 3C:
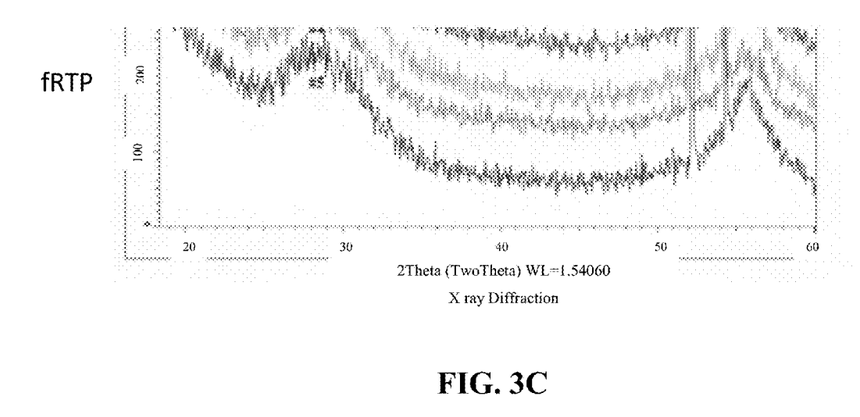
Figure 3D:
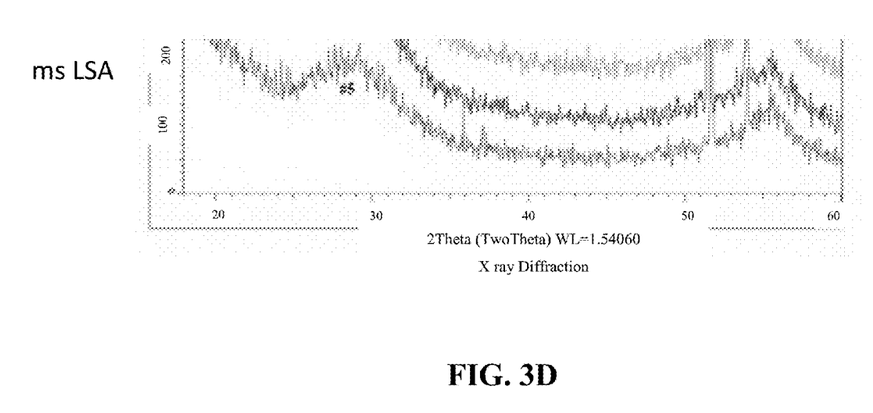
Figure 3E:
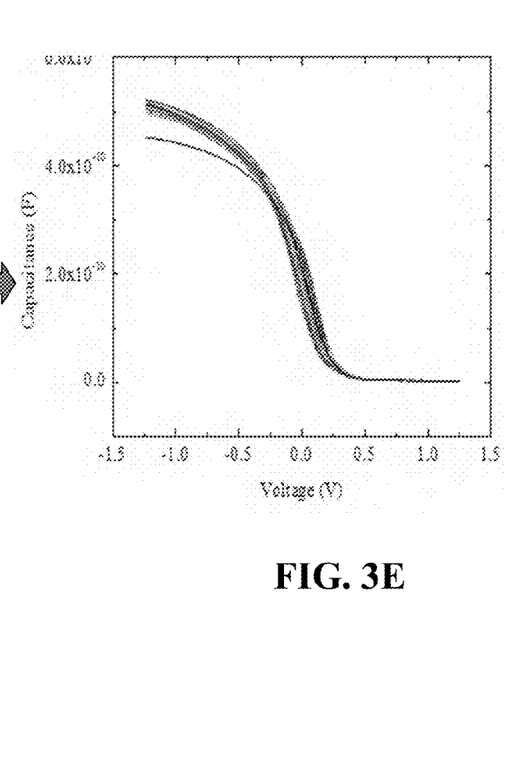

On a blanket silicon wafer, a silicon dioxide interlayer was deposited. An ~11.5 Å thick $HfO_2$ high-k dielectric film was deposited directly on the $SiO_2$ interlayer. In an ASM Eagle XP for ALD, PLAD of helium was performed, followed by application of a high voltage bias at 10 kV, thereby forming an ~11.5 Å thick $HfO_2$ high-k dielectric film containing both monoclinic and tetragonal phase $HfO_2$. FIG. 3A provides a Grazing incident X-ray diffraction(GIXRD) chart for the $HfO_2$ high-k dielectric film post PLAD and high voltage bias. As shown, $HfO_2$ in the film was primarily monoclinic. FIG. 3E shows a corresponding capacitance vs. voltage chart for the example, evidencing no current leakage, thereby indicating that the quality of the $HfO_2$ has been substantially improved as compared to prior art $HfO_2$ films (see also, e.g., comparative examples below).

Example 2

Figure 3F:
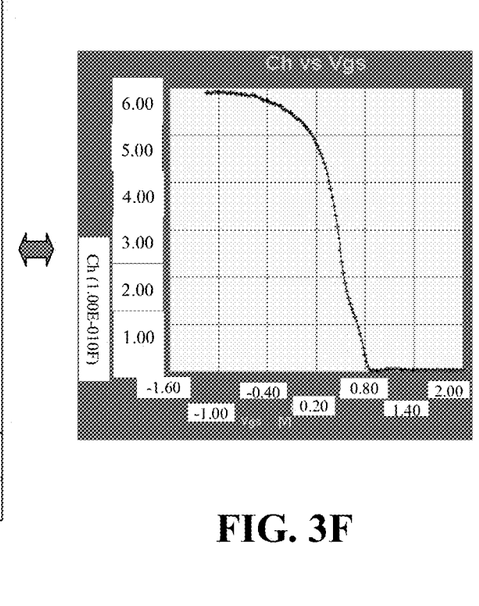

An $HfO_2$ film was prepared as described in Example 1 above, then, following application of the high voltage bias, a post deposition anneal (fRTP) (1200° C. flash-RTP) was performed. FIG. 3B provides a Grazing incident X-ray diffraction chart for the $HfO_2$ high-k dielectric film post PLAD, high voltage bias, and fRTP anneal. As shown, the peak was more pronounced, and there was significantly more tetragonal phase $HfO_2$ present in the film as compared to Example 1. FIG. 3F shows a corresponding capacitance vs. voltage chart for the example, evidencing no current leakage, thereby indicating that the quality of the $HfO_2$ has been substantially improved as compared to prior art $HfO_2$ films (see also, e.g., comparative examples below).

Comparative Example 3

Figure 3G:
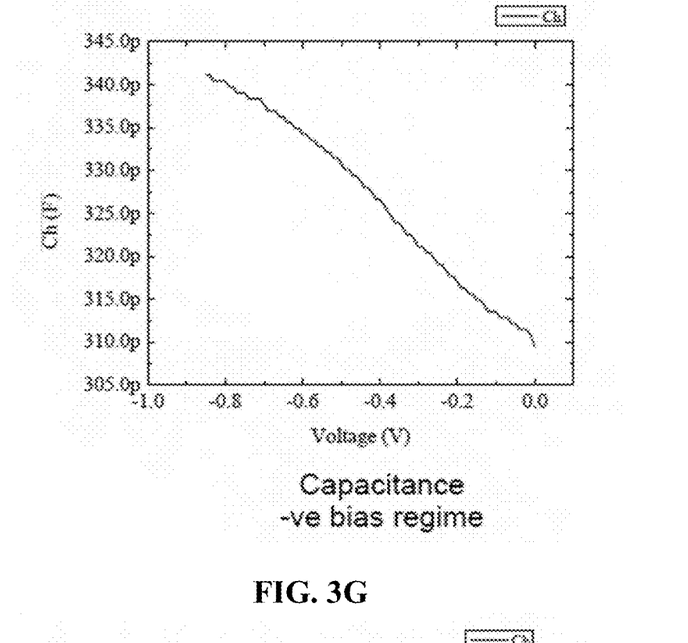
Figure 3H:
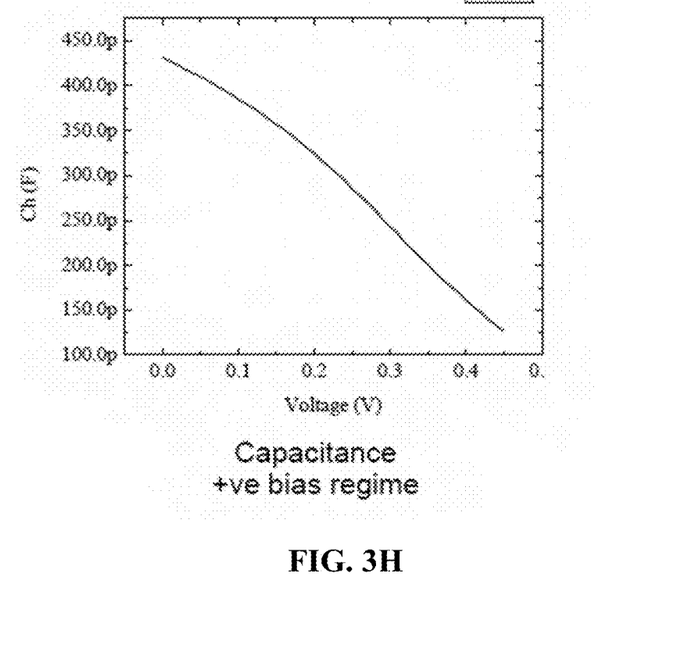

On a blanket silicon wafer, a silicon dioxide interlayer was deposited. An ~11.5 Å thick $HfO_2$ high-k dielectric film was deposited directly on the $SiO_2$ interlayer. fRTP anneal was performed to enhance densification of the $HfO_2$. FIG. 3C provides a gradient incident X-ray diffraction chart for the $HfO_2$ high-k dielectric film post fRTP anneal (1200° C. flash-RTP). As shown, no tetragonal phase $HfO_2$ was detected. FIGS. 3G and 3H are corresponding charts for the comparative example. As can be seen, compared to the above inventive examples, high leakage is present. Accordingly, unlike the inventive examples (see, e.g., FIGS. 3E and 3F) no "S" feature is present. This is because accumulation/inversion region could not be obtained, due to higher leakage beyond the biases shown.

Comparative Example 4

An $HfO_2$ film was prepared as described in Comparative Example 3 above, except, instead of the fRTP (1200° C. flash-RTP) post-deposition anneal, a 1200° C. LSA was performed. FIG. 3D provides a gradient incident X-ray diffraction chart for the $HfO_2$ high-k dielectric film post ms LSA anneal. As shown, no tetragonal phase $HfO_2$ was detected. Further testing revealed that high leakage was present, and an accumulation/inversion region could not be obtained, due to the high leakage.

Comparative Example 5

An $HfO_2$ film was prepared as described in Comparative Example 3 above, except, instead of the fRTP (1200° C. flash-RTP) post-deposition anneal, a spike 900° C. anneal was performed. As was the case for Comparative Example 3, no tetragonal phase $HfO_2$ was detected, high leakage was present, and an accumulation/inversion region could not be obtained, due to the high leakage.

The above data demonstrate advantages associated with embodiments of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "comprising" and "including" or grammatical variants thereof are to be taken as specifying the stated features, integers, steps or components but do not preclude the addition of one or more additional features, integers, steps, components or groups thereof. This term encompasses the terms "consisting of" and "consisting essentially of".

The phrase "consisting essentially of" or grammatical variants thereof when used herein are to be taken as specifying the stated features, integers, steps or components but do not preclude the addition of one or more additional features, integers, steps, components or groups thereof but only if the additional features, integers, steps, components or groups thereof do not materially alter the basic and novel characteristics of the claimed composition, device or method.

Where one or more ranges are referred to throughout this specification, each range is intended to be a shorthand format for presenting information, where the range is understood to encompass each discrete point within the range as if the same were fully set forth herein.

While several aspects and embodiments of the present invention have been described and depicted herein, alternative aspects and embodiments may be affected by those skilled in the art to accomplish the same objectives. Accordingly, this disclosure and the appended claims are intended to cover all such further and alternative aspects and embodiments as fall within the true spirit and scope of the invention.

The invention claimed is:

1. A method of forming a semiconductor device, said method comprising:
    forming, on a semiconductor substrate, a 10 to 40 Å thick dielectric layer comprising at least one of hafnium dioxide ($HfO_2$) and zirconium dioxide ($ZrO_2$), said dielectric layer having a continuous planar surface;
    after forming the dielectric layer, performing plasma deposition of an inert gas, such that the inert gas penetrates the continuous planar surface of the dielectric layer, thereby forming an inert gas impregnated dielectric layer; and
    after performing the plasma deposition, applying a high voltage bias at 7kV-15kV to the inert gas impregnated dielectric layer, thereby forming a high-k dielectric layer comprising at least some tetragonal phase $HfO_2$ or tetragonal phase $ZrO_2$.

2. The method according to claim 1, wherein the dielectric layer comprises $ZrO_2$.

3. The method according to claim 1, wherein the dielectric layer comprises $HfO_2$.

4. The method according to claim 1, wherein the dielectric layer consists essentially of $HfO_2$.

5. The method according to claim 1, wherein the inert gas is selected from argon and helium.

6. The method according to claim 5, wherein the inert gas is helium.

7. The method according to claim 6, wherein the dielectric layer comprises $HfO_2$.

8. The method according to claim 7, wherein, after applying the high voltage bias, at least 50% of the $HfO_2$ present in the high-k dielectric, is in the tetragonal phase.

9. The method according to claim 1, wherein, after applying the high voltage bias, at least 50% of the total $HfO_2$ and $ZrO_2$ present in the high-k dielectric, is in the tetragonal phase.

10. The method according to claim 1, wherein the high-k dielectric layer is 10 to 20 Å thick.

11. The method according to claim 1, wherein the semiconductor substrate comprises a silicon dioxide interlayer and the dielectric layer is formed directly on the silicon dioxide interlayer.

12. The method according to claim 1, wherein the high-k dielectric layer comprises at least one of:
    hafnium dioxide ($HfO_2$), wherein at least 50% of said $HfO_2$ is in the tetragonal phase; or
    zirconium dioxide ($ZrO_2$), wherein at least 50% of said $ZrO_2$ is in the tetragonal phase.

* * * * *